United States Patent [19]

Rusch et al.

[11] Patent Number: 4,893,169

[45] Date of Patent: Jan. 9, 1990

[54] LEAD FRAME AND A PROCESS FOR THE PRODUCTION OF A LEAD WITH THIS LEAD FRAME

[75] Inventors: Helmut Rusch; Guenter Waitl; Hansjoerg Harrasser, all of Regensburg; Hans-Juergen Richter, Planegg, all of Fed. Rep. of Germany; Lee Francis, Melaka, Malaysia; Alois Seidl, Regensburg, Fed. Rep. of Germany; Hans Wissinger, Regensburg, Fed. Rep. of Germany; Hans-Joachim Hampel, Regensburg, Fed. Rep. of Germany

[73] Assignee: Siemens Aktiengesellschaft, Berlin and Munich, Fed. Rep. of Germany

[21] Appl. No.: 181,881

[22] Filed: Mar. 28, 1988

Related U.S. Application Data

[63] Continuation of Ser. No. 895,626, Aug. 11, 1986, abandoned.

[30] Foreign Application Priority Data

Sep. 30, 1985 [DE] Fed. Rep. of Germany ....... 3534916

[51] Int. Cl.⁴ ...................... H01L 23/48; H01L 33/00
[52] U.S. Cl. ......................................... 357/70; 357/68
[58] Field of Search ............................. 357/68, 70, 79

[56] References Cited

U.S. PATENT DOCUMENTS 3,899,305  8/1975  Hilgers ................................. 357/70
4,312,926  1/1982  Burns .................................. 428/571
4,380,042  4/1983  Angelucci, Sr. et al. .......... 361/421
4,477,827 10/1984  Walker et al. ....................... 357/70
4,587,548  5/1986  Grabbe et al. ....................... 357/70

FOREIGN PATENT DOCUMENTS 0217082  4/1987  European Pat. Off. .............. 357/68
0043549  3/1983  Japan ................................... 357/70
0220479 12/1983  Japan ................................... 357/70
6107673  1/1986  Japan ................................... 357/70
0179558  7/1988  Japan ................................... 357/70

OTHER PUBLICATIONS

Milliken, IBM Technical Disclosure Bulletin, "Electrode Pattern", vol. 11, No. 7, Dec./68, p. 850.

Primary Examiner—Andrew J. James
Assistant Examiner—Viet Q. Nguyen
Attorney, Agent, or Firm—John Francis Moran

[57] ABSTRACT

A lead frame adapted for a plurality of semiconductor chips in which, for each semiconductor chip, at least one electric terminal is extended out of the package after encapsulation of the lead frame. In addition, a process for the production of a lead with this lead frame, enables a full automation of the lead assembly and good, reliable production. The lead frame has at least one mechanical node (T1, T2, T3, T4; T) at which, by severing a single reinforced node, at least three electric conductors (1, 2, G; 3, 4, G; 5, 6, G; 7, 8, G; 21, 22, 23) are electrically separated from one another.

5 Claims, 1 Drawing Sheet

LEAD FRAME AND A PROCESS FOR THE PRODUCTION OF A LEAD WITH THIS LEAD FRAME

This is a continuation of application Ser. No. 06/895,626 filed Aug. 11, 1986, abandoned.

BACKGROUND OF THE INVENTION

This invention relates to lead frames and, it relates, more particularly, to lead frames mechanically reinforced by mechanical nodes as well as a process for the production of such lead frames.

In the case of many electrical leads, it is necessary for more than one semiconductor configuration to be assembled on a lead frame. At the same time, it is required, upon completion of the assembly work, for at least one electric terminal to be brought out of the package encapsulating the lead separately. For example, in the case of conductive strip LED displays, eight discrete semiconductor chips per indicating element (digit) must be assembled on a lead frame. At the same time, at least one electric terminal per semiconductor chip must be brought out of the display package separately. This results in a terminal arrangement that is highly intricate so as to be an unstable chip carrier.

One difficultly which arises with display leads is that they must be bent in a U-shape prior to assembling. In this respect, as a result of the required conductive strip configuration, problems caused by the fanning out of unused terminal arise in the plane of the lead frame as well as in the terminal position.

In this situation, these problems were responsible for total breakdown during production and early breakdowns at the installation site, caused by wire stress. So far, there has been an attempt to solve these problems prior to assembling the lead by applying to the lead frame a stabilizing and electrically insulating reinforcement material such as a foil or film or resin.

There has also been one approach to solve this problem by embedding the lead frame in thermoplastic or duroplastic plastics. This also introduces problems. Among them are increased costs, inadequate temperature stability during processing, and inadequate cleanliness of the bonding planes.

There is another approach to solve these problems by means of different frame concepts, for example, by using a pc board instead of a lead frame. This in turn, produces new problems associated with the high costs of material and assembly.

SUMMARY OF THE INVENTION

It is an object of the present invention to provide a lead frame of the foregoing type, as well as a process for the production of this lead frame, which enable a complete automation of the assembly of lead frames to facilitate high quality and reliable manufacture.

The illustrative lead frames in accordance with an embodiment of the invention are reinforced with gridlike bridges. These bridges or mechanical nodes can be produced advantageously and at no extra cost during the punching of the lead frame. This produces an intrinsically stable lead frame.

None of the problems relating to conventional practices, such as described in the introduction hereof, will occur in any of the operating cycles required for the production of a lead frame embodying the inventive principles. A lead frame according to the invention thus enables a full mechanization or automation of the lead assembly with a lead frame, and good production characteristics. Upon completion of the assembly steps required for the production a lead with a lead frame, the mechanical nodes can be severed. These mechanical nodes may even be severed after that assembly step during which the frame has already been so stabilized that breakdown and quality impairing effects can no longer occur. Such an operating cycle usually comprises the encapsulation or positioning of the semiconductor chips arranged on the lead frame.

The mechanical nodes may be severed advantageously in accordance with the following process:

The mechanical nodes may be severed by drilling. The drilling process for severing the nodes can be performed in a manner analogous with the process used in pc board production.

The mechanical nodes may be separated by high-current electric pulses.

The mechanical nodes may be separated by means of light energy produced by a laser.

The mechanical nodes may be separated by means of ultrasonic application.

The mechanical nodes may be separated mechanically, for example, by punching, cutting, etc.

The mechanical nodes may be separated chemically, for example, by selective etching.

BRIEF DESCRIPTION OF THE DRAWING

Features of the invention and additional objects of the invention will be more readily appreciated and better understood by reference to the following detailed description of various illustrative embodiments which should be considered in conjunction with the drawing.

DETAILED DESCRIPTION

Figure 1:
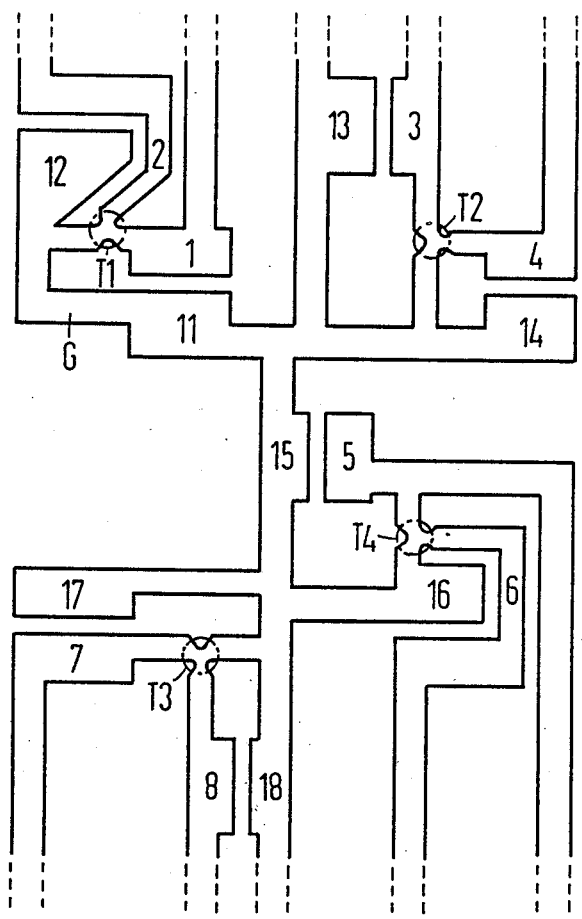
FIG. 1 illustrates a display lead frame with internal reinforcements or mechanical nodes.

FIG. 1 depicts a display lead frame including a number of internal reinforcements (metal nodes) T1, T2, T3, T4. In FIG. 1, the area of the lead frame, which corresponds to a single indicating or display element (digit), is indicated by continuous lines. The lead frame shown in FIG. 1 can be continued on several sides in a single piece for the additional indicating elements of a conductive strip LED display lead frame. The continuations of the lead frame for providing a continuous lead frame are indicated with dotted lines in FIG. 1.

An indicating element (digit) with eight discrete semiconductor chips can be assembled in the lead frame section indicated by continuous lines in FIG. 1. Eight electrical terminals or contacts are designated 1 through 8, i.e., one additional electric terminal for each semiconductor chip, must be brought out separately from the subsequently to be produced lead package which will encapsulate the eight discrete semiconductor chips of the indicating element (digit). The eight electric terminals 1 through 8 serve as a means whereby the eight discrete semiconductor chips of the indicating element (digits) are selected.

All eight discrete semiconductor chips can be connected via the ground wire G to the ground potential. For this purpose, the ground wire G is provided with eight contact points designated 11 through 18.

The lead frame shown in FIG. 1 is reinforced with grid-like bridges T1, T2, T3, T4. These bridges or mechanical nodes T1, T2, T3, T4 are produced at no extra cost during the punching of the lead frame. This produces an inherently stable lead frame. Always interconnected with the nodes T1, T2, T3, T4 are three individual electric conductors, namely the electric conductors 1, 2, G at node T1, the electric conductors 3, 4, G at node T2, the electric conductors 7, 8, G at node T3, and the electric conductors 5, 6, G at node T4.

Due to the presence of its mechanical nodes T1, T2, T3, T4, the lead frame according to FIG. 1 enables a full mechanization of the lead assembly, as well as good production. Upon completion of all assembly steps, the nodes T1, T2, T3 T4 are severed.

Further, it is particularly advantageous that, by severing a respective individual node, three formerly interconnected electric wires are ultimately electrically insulated from one another. Similarly, it is also advantageous that the lead frame attains a rather high degree of stability by the application of a relatively small number of internal reinforcements (T1, T2, T3, T4).

Upon completion of all assembly steps, due to the final encapsulation or positioning of the semiconductor chips in relation to the electric wires, which at that point has already occurred, the stability of the lead frame is such during the subsequent severing of nodes T1, T2, T3, T4, that breakdowns and quality-impairing effects are no longer occassioned.

Figure 2:
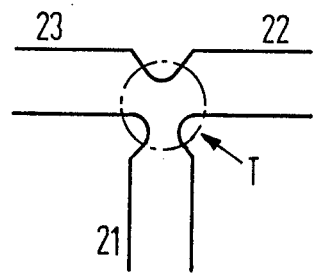
FIG. 2 serves to explain the concept of the nodes.

FIG. 2 provides an enlarged view of the node T for explaining the concept of the invention. The three electric conductors 21, 22, 23 meet at node T. At this node T, the three electric wires 21, 22, 23 form a single conductor. The reinforced note T has the advantage of offering planar expansion possibilities, so that this reinforced node may be severed quickly without effort, and, on the other hand, it ensures adequate stability of the lead frame during the assembly of the lead. For this purpose, node T offers the advantage of restrictions producing reduced cross sectional areas which facilitate the safe severing of node T.

The semiconductor chips on the lead frame can either be sealed in, encapsulated or affixed by some other means. The assembly lead frame can be punched or etched from a suitable metal strip. Suitable metal are copper, iron, brass, nickel, silver, etc. Depending on special requirements, the metal strip may be adapted to any width or thickness. In particular, such a metal strip may have practical dimensions of approximately 0.25 mm thick and 2.5 cm wide. In accordance with special requirements, the electric conductors can also be developed in a corresponding width and thickness. In particular, the internal reinforcements (nodes) can, at their narrowest point, have a linear dimension of 0.2 mm. A lead frame according to the invention can, for reasons of space, have additional reinforced mechanical nodes, and after these nodes have been severed, only two electric conductors will be separated from one another.

There has thus been shown and described a novel lead frame carrier which fulfills all the objects and advantages sought therefor. Many changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are deemed to be covered by the invention which is limited only by the claims which follow.

We claim:

1. A lead frame carrier for semiconductor chips for encapsulation into a package, the lead frame carrier comprising a patterned area for a plurality of semiconductor chips including a plurality of first electrical leads each one of the plurality of semiconductor chips having a first electrical lead extending outward from a region selected for encapsulation to provide a plurality of external leads, the patterned area including a common conductor having a plurality of semiconductor chip receiving areas within the region and extending outward from the region to provide at least one external connection, a plurality of connecting points located in the region, each connecting point connected between at least one of said first electric leads and the common conductor for providing mechanical rigidity for the lead frame carrier through their connections and each connecting point having a reduced cross sectional area coupling between the common conductor and each one of the selected electrical leads.

2. A lead frame carrier in accordance with claim 1 further comprising patterned areas wherein selected ones of the external leads mechanically couple patterned areas of the lead frame carrier together to provide a strip of successive patterned areas.

3. A lead frame carrier in accordance with claim 1, wherein the common conductor is connected to ground potential.

4. A lead frame carrier in accordance with claim 1, wherein the plurality of semiconductor chips comprises eight discrete semiconductor chips forming an LED display element and the plurality of connecting points comprises four mechanical nodes each mechanically connected to a semiconductor chip receiving area and two of said first electrical leads.

5. A lead frame carrier in accordance with claim 4, wherein the four connecting points are spatially arranged within the region of the lead frame carrier to form corners of a four sided planar area.

* * * * *